(12) United States Patent
Moriya

(10) Patent No.: US 6,374,381 B1
(45) Date of Patent: Apr. 16, 2002

(54) SEMICONDUCTOR MEMORY DEVICE, AND METHOD OF CHECKING THE SEMICONDUCTOR DEVICE AND METHOD OF USING THE SAME

(75) Inventor: Takaaki Moriya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/271,331

(22) Filed: Mar. 18, 1999

(30) Foreign Application Priority Data

Mar. 19, 1998 (JP) .......................................... 10-070429

(51) Int. Cl.[7] ................................................ H04L 1/00
(52) U.S. Cl. ........................ 714/746; 714/763; 714/764
(58) Field of Search ................................ 714/5, 6, 703, 714/766, 723, 746, 763, 718, 764, 768, 773

(56) References Cited

FOREIGN PATENT DOCUMENTS

| JP | 62-146500 | 6/1987 |
| JP | 1-209552 | 8/1989 |
| JP | 5-4266 | 1/1993 |
| JP | 8-263391 | 10/1996 |

*Primary Examiner*—David Ton
(74) *Attorney, Agent, or Firm*—Foley & Lardner

(57) ABSTRACT

A semiconductor memory device has a memory circuit, a code tagging section, an error processing section, and a changeover circuit. The memory circuit writes and reads data into and from a memory area designated by an address signal. The code tagging section includes a write data register and an error correction code generation circuit for tagging an error checking code to input data, and sending it to the memory circuit as write data. The error processing section includes an error detection circuit and an error correction circuit for checking presence of an error after receiving read data from the memory circuit and correcting it when detected. The changeover circuit sends data from the code tagging section to the error processing section, and sends data from the code tagging section to the error processing section only when the address signal does not designate a memory area in the memory circuit.

16 Claims, 11 Drawing Sheets

SEMICONDUCTOR MEMORY DEVICE, AND METHOD OF CHECKING THE SEMICONDUCTOR DEVICE AND METHOD OF USING THE SAME

BACKGROUND OF THE INVENTION

1. Field of the Invention

The present invention relates to a semiconductor memory device, and a method of checking the semiconductor device and a method of using the same, and more specifically to a semiconductor memory device having an error detection/correction function, and a method of checking the semiconductor memory device and a method of using the same.

2. Description of the Related Art

Conventionally, a semiconductor device often includes an error checking and correcting circuit (hereinafter referred to ECC.) other than a semiconductor memory for storing data. Japanese Patent Laid-Open Publication No. Hei01-209552 discloses such a semiconductor memory device. In accordance with the semiconductor device, even if any error happens in data upon write and read operation of the data, the semiconductor memory device checks the data and corrects the error in itself to improve reliability thereof.

FIG. 10 illustrates an example of such a semiconductor device as the type described above. The semiconductor memory device includes an address register 101, a write data register 102, an error correction code generation circuit 103, a memory circuit 104, a changeover circuit 105, an error detection circuit 106, an error detection flag register 107, an error correction circuit 108, a read data register 109, and a test mode register 110.

The semiconductor memory device includes an external device (not shown) connected thereto through a bus (not shown) connected with the address register 101, the write data register 102, the error detection flag register 107, the read data register 109, and the test mode register 110.

When the external device connected with the semiconductor memory device writes data in the memory circuit 104, a signal indicative of an ordinary mode is applied to a test mode register 110. The test mode register 110 after receiving the signal applies it to the switching circuit 105 as a control signal. The switching circuit 105 after receiving the control signal h2 indicative of the foregoing signal, it connects the memory circuit 104 to the error detection circuit 106 and the error correction circuit 108.

Thereafter, the external device applies the data to be written in the memory circuit 4 to the write data register 102. The write data register 102 after receiving the data applies the data to the error correction code generating circuit 103. The error correction code generation circuit 103 generates an error correction code for the foregoing data. Thereafter, the error correction code generation circuit 103 applies the generated error correction code to the foregoing data, and sends it to the memory circuit 104 as write data h3.

Upon writing data the external device applies a signal indicative of an instruction of read operation and of address. The address register 101 after receiving the foregoing signal applies it to the memory circuit 104 as an address signal h1. The memory circuit 104 after receiving the address signal hi stores write data h3 in an memory area corresponding to an address indicated by the address signal h1. Upon reading the data the external device applies the signal indicative of an instruction of read operation and of an address to the address register 101. The address register 101 after receiving the foregoing signal applies it to the memory circuit 104 as the address signal h1. The memory circuit 104 after receiving the address signal h1 reads the data from a memory area corresponding to the address indicated by the address signal h1, and sends the data to the switching circuit 105 as read data h4. The switching circuit 105 sends the read data h4 received from the memory circuit 104 to the error detection circuit 106 and the error correction circuit 108.

The error detection circuit 106 judges based upon an error correction code added to the read data h4 whether or not any error is existent in the red data h4. If the read data h4 has any error, then the error detection circuit 106 sends a flag indicative of error detection to the error detection flag resistor 107. The error detection flag register 107 holds the foregoing flag and informs the outside of happening of any error.

Simultaneously, the error detection circuit 106 sends a detection result indicative of the detection of any error to the error correction circuit 108. The error correction circuit 108 corrects the error in the read data h4 based upon the detection result. Thereafter, the error correction circuit 108 sends the read data h4 subject to the error correction to the read data register 109.

FIG. 11 illustrates such an error detection circuit 106 and an error correction circuit 108. The illustrated error detection circuit 106 and error correction circuit 108 checks presence of any error, the number of error bits, position of any error bit based upon a parity check matrix H represented by a formula 1. The error detection circuit 106 includes a syndrome generation circuit 106-1 and a syndrome decode circuit 106-2 as illustrated in FIG. 11.

$$H = \begin{vmatrix} 0 & 1 & 1 & 1 & 1 & 0 & 0 \\ 1 & 0 & 1 & 1 & 0 & 1 & 0 \\ 1 & 1 & 0 & 1 & 0 & 0 & 1 \end{vmatrix} \quad (1)$$

The syndrome generation circuit 106-1 is to generate a syndrome value using the read data h4, an example of which is illustrated in FIG. 12. The syndrome generation circuit 106-1 includes EXOR (exclusive or) 106A to 106J. When the read data h4 comprises bits x0 to x6, the syndrome generation circuit 106-1 calculates syndrome values s0, s1 and s2 using the following formula. In the read data h4, x0 to x3 are information bits corresponding to the data, and x4 to x6 inspection bits corresponding to the error correction code.

s0=x1*x2*x3*x4
s1=x0*x2*x3*x5
s2=x0*x1*x3*x6

Herein, a code "*" in the foregoing formulae represents logical sum. Thereafter, the syndrome generation circuit 106-1 outputs the calculated syndrome values s0, s1 and s2 from EXOR gates 106C, 106F and 106J to the syndrome decode circuit 106-2.

The syndrome decode circuit 106-2 decodes the syndrome values s0, s1 and s2 and calculates the presence of any error, the number of error bits and the position of the error bit, and so on. The syndrome decode circuit 106-2 includes inverters 106K to 106M, a NOR gate 106N, an inverter 106P and NAND gates 106Q to 106T.

The syndrome decode circuit 106-2 after receiving the syndrome values s0, s1 and s2 outputs an error detection signal EF as the foregoing flag from the inverter 106P using the following formulae and simultaneously generates bits y0 to y6 using the following formula together with the error correction circuit 108 including the EXOR gates 108A to 108D.

y0=x0*((−s0)·s1·s2)
y1=x1*(s)·(−s1)·s2)
y2=x2*(s0·s1·(−s2)
y3=x3*(s0·s1·s2)
y4=x4*(s0·(−s1)·(−s2))
y5=x5*((−s0)·s1·(−s2))
y6=x5*((−s0)·(−s1)·(−s2))
EF=s0+s1+s2

In the foregoing eight formulae, a code "−" represents logical inversion and a code "+" represents logical sum. In FIG. 12 an error correction circuit for bits y4 to y6 corresponding to check bits x4 to x6 is omitted.

The error detection circuit 106 sends the foregoing flag generated as such to the error detection flag register 107. If there is no error, then the foregoing flag indicates "0" while if there is any error, then the foregoing flag indicates "1". The error correction circuit 108 sends the generated bits y0 to y3 to the read data register 109 as the read data h4. Such an error correction code generation circuit 103, error detection circuit 106 and error correction circuit 108 constitute the ECC circuit.

For checking whether or not the error detection/correction function of the ECC circuit operates normally the foregoing external device diagnoses any trouble of the ECC circuit. Upon diagnosis of the trouble of the ECC circuit the external device applies the control signal h2 indicative of a test mode to the switching circuit 105 through a test mode register 110. The changeover circuit 105 after receiving the control signal h2 of the test mode separates the memory circuit 4 and connects the error correction code generation circuit 103 to the error detection circuit 106 and the error correction circuit 108.

Thereafter, the external device once applying write data containing error and write data not containing error to the write data register 102, the write data is applied to the error detection circuit 106 and the error correction circuit 108 after passage through the error correction code generation circuit 103 and the changeover circuit 105. Operation of the error detection circuit 106 and the error correction circuit 108 is clarified on the basis of the flag of the error detection flag and data of the read data register 109.

Hereby, the external device compares data applied to the write data register 102 and data from the read data register 109 with each other and checks whether or not the error detection/correction function of the ECC circuit composed of the error correction code generation circuit 103, error detection circuit 106 and error correction circuit 108 based upon the value of the flag in the error detection flag register 107.

The prior art illustrated in FIG. 10 however suffers from the following problems: The external device applies the control signal h2 indicative of the ordinary mode and the test mode to the changeover circuit 105 in order to control the changeover operation of the changeover circuit 105. For this, the aforementioned prior semiconductor memory device has a trouble that there is required generation means for generating the control signal h2. The semiconductor memory device has also another trouble that there is required the test mode register 110 for applying the control signal h2 to the changeover circuit 105.

SUMMARY OF THE INVENTION

The present invention has been made to solve the aforementioned problems of the prior art, and has an object to provide a semiconductor memory device capable of simplifying changeover between an ordinary mode and a test mode and of shortening test time for an error detection and error correction function, and further provide a method of checking the semiconductor memory device and a method of using the same.

To achieve the foregoing object, a semiconductor memory device, according to a first aspect of the present invention, is featured by comprising: a memory part which includes m memory areas (m is an arbitrary natural number, same in the following.) each for storing data for writing and reading data into and from a memory area designated by an input address signal, the memory part including m memory areas each for storing data; a code tagging section for tagging a code for checking any error of the data to the input data and sending the data to which the code is tagged to the memory section; a changeover section for outputting the data from the memory section when the address signal designates the memory area of the memory part and outputting the data from the code tagging section when the address signal does not designate the memory area of the memory section; and an error processing section for checking the presence of any error of the data based upon the code tagged to the data when the data from the changeover section, and correcting an error when the error is detected and outputting the data.

A semiconductor memory device, according to a second aspect of the present invention, is featured by comprising a memory section which includes p memory parts among n memory areas set as memory parts for writing and reading data into and from a memory area designated by an input address signal after the input address signal designates the memory part, a code tagging section for adding a code for checking any error in input data to the input data and sending the data to which the code is tagged to the memory part; a changeover section for outputting the data from the memory section when the foregoing address signal designates a memory area in the memory part, and further outputting the data from the code tagging section when the foregoing address signal doe not designate the memory area in the memory part; and an error processing section for checking presence of any error in the data based upon the code tagged to the data after receiving the data from the changeover section, and correcting when any error is detected, the error and outputting the same.

A semiconductor memory device, according to a third aspect of the present invention, is that described in the first and second aspects, and is featured by further comprising a bypass section for permitting the data inputted into the code tagging section to bypass the code tagging section; and a bypass changeover part interposed between the code tagging section and the memory part for sending the data from the code tagging section the data from the bypass section to the memory section in response to the input changeover signal.

A semiconductor memory device, according to a fourth aspect of the present invention, is featured by comprising: a memory part for writing and reading data with the aid of an input address signal; a code tagging section for tagging a code for checking any error in input data to the input data, and outputting the data to which the code is tagged; a bypass section for permitting the data inputted into the code tagging section to bypass the code tagging section; a bypass changeover section for sending the data from the code tagging section or the data from the bypass section to the foregoing memory section in response to an input first changeover signal; and an error processing section for checking, as receiving the data from the memory section when an input second changeover signal indicates an error processing, presence of error in the data based upon the code tagged to the data, and correcting, when any error is detected, the error and outputting the data, and, when the input second changeover signal indicates release of the error processing, outputting the data received from the memory section as it is.

A semiconductor memory device, according to a fifth aspect of the present invention, is featured by comprising: a memory part which includes m memory areas each for writing and reading data into and from a memory area designated by an input address signal; a code tagging section for adding a code to check error in input data to the input data, and outputting the data to which the aforesaid code is added; a bypass part for permitting the data inputted to the code tagging section to bypass the aforesaid code tagging section: a bypass changeover section for sending the data from the code tagging section or the data from the bypass section to the memory section in response to an input first changeover section; a changeover section for outputting the data from the memory section when the address signal designates a memory area in the aforesaid memory section while outputting the data from the bypass changeover section when the address signal does not designate the memory area of the aforesaid memory section; an error processing section for checking, after receiving data from the aforesaid changeover section when an input second changeover signal indicates an error processing, presence of any error in the data based upon the code tagged added to the data, and when any error is detected, correcting the error and outputting the data while, when the input second changeover signal indicates release of the error processing, outputting the data received from the changeover section as it is.

A semiconductor memory device, according to a sixth aspect of the present invention, is featured by comprising: a memory section, which includes p memory parts with n memory areas taken as each memory part, for writing and reading, after an input address signal designates the memory part, data into the memory area designated by the address signal; a code tagging section for tagging a code to check error in input data to the input data, and outputting the data to which the code is tagged to a bypass section for permitting the data inputted into the code tagging section to bypass the code tagging section; a bypass changeover section for sending the data from the code tagging section or the data from the bypass section to the memory section in response to an input first changeover signal; a changeover section for outputting the data from the memory section when the address signal designates a memory part of the memory section while outputting the data from the bypass changeover section when the address signal does not designate the memory part of the memory section; and an error processing section for checking, after receiving the data from the changeover section when an input second changeover signal indicates an error processing, presence of any error in the data based upon the code tagged to the data, and when any error is detected, correcting the error and outputting the data while the inputted second changeover signal indicates release of the error processing, outputting the data received from the changeover section.

A method of checking a semiconductor memory device described in the first aspect, according to a seventh aspect of the present invention, is featured by comprising: a first step of applying an address signal that does not designate a memory area of the aforesaid memory section to the aforesaid changeover section; a second step of applying checking data to the aforesaid code tagging section after the first step is completed; and a third step of judging whether the aforesaid code tagging section and the aforesaid error processing section are good or not by comparing, after receiving the data outputted by the error processing section in response to the data inputted in the second step, the just mentioned data with the data used in the second step.

A method of checking a semiconductor memory device described in the second aspect, according to an eighth aspect of the present invention, is featured by comprising: a first step of applying an address signal not designating the memory area of the aforesaid memory section to the aforesaid changeover section; a second step of applying checking data to the aforesaid code addition section after the first step is completed; and a third step of judging whether the aforesaid code addition section and the aforesaid error processing section are good or not by comparing, once receiving data outputted by the aforesaid error processing section in response to the data inputted by the aforesaid second step, the just mentioned data with the data used ion the second step.

A method of checking a semiconductor memory device described in the third aspect, according to a ninth aspect of the present invention, is featured by comprising: a first step of applying an address signal not designating the memory area of the aforesaid memory section to the aforesaid changeover section, and further applying a changeover signal instructing bypass to the aforesaid bypass changeover section; a second step of applying checking data to the aforesaid code tagging section after the first step is completed; a third step of comparing, after receiving data outputted from the aforesaid error processing section in response to the data inputted by the second step, the just mentioned data with the data used in the second step; a fourth step of applying a changeover signal instructing release of the bypass to the aforesaid bypass changeover section after the third step is completed; a fifth step of applying checking data to the aforesaid code tagging section after the fourth step is completed; and a sixth step of judging whether the aforesaid code tagging section is good or not by comparing, once receiving the data outputted from the aforesaid error processing section in response to the data inputted by the fifth step, the just mentioned data with data used in the fourth step.

A method of checking a semiconductor memory device described in the fourth aspect, according to a tenth aspect of the present invention, is featured by comprising: a first step of applying a first changeover signal instructing bypass to the bypass changeover section, and further applying a second changeover signal indicative of error processing to the error processing section; a second step of applying checking data to the code addition section after the first step is completed; a third step of judging whether the aforesaid error processing section is good or not by comparing, once receiving the data outputted from the error processing section in response to the data inputted by the second step, the just mentioned data with the data used in the second step; a fourth step of applying a changeover signal instructing release of bypass to the bypass changeover section after the third step is completed; a fifth step of applying checking data to the code tagging section after the fourth step is completed; and a sixth step of judging whether the aforesaid code tagging section is good or not by comparing, once receiving the data outputted from the error processing section in response to the data inputted by the fifth step, the just mentioned data with the data used in the fourth step.

A method of checking a semiconductor memory device described in the fifth aspect, according to an eleventh aspect of the present invention, is featured by comprising: a first step of applying an address signal not designating the memory part of the memory section to the changeover section, and applying a first changeover signal instructing bypassing to the changeover section, and further applying a second changeover signal indicative of error processing to the error processing section; a second step of applying checking data to the code tagging section after the first step is completed; a third step of judging whether the aforesaid error processing section is good or not by comparing, after receiving data outputted from the error processing section, the just described data with the data used in the second step; a fourth step of applying a changeover signal instructing release of bypassing to the aforesaid bypass changeover section after the third step is completed; a fifth step of applying checking data to the code tagging section after the fourth step is completed; and a sixth step of judging whether the aforesaid code tagging section is good or not by comparing, after receiving the data outputted from the aforesaid error processing section, the just described data with the data used in the step 4, in response to the data inputted by the fifth step.

A method of checking a semiconductor memory device described in the sixth aspect, according to the twelfth aspect of the present invention, is featured by comprising: a first step of applying an address signal not designating a memory part in the aforesaid memory section to the aforesaid changeover section, and applying a first changeover signal instructing bypassing to the aforesaid bypass changeover section, and further applying a second changeover signal indicative of error processing to the aforesaid error processing section; a second step of applying checking data to the aforesaid code tagging section after the first step is completed; a third step of judging whether the aforesaid error processing section is good or not by comparing, after receiving data outputted from the aforesaid error processing section, the data with the data used in the second step, in response to the data inputted by the second step; a fourth step of applying a changeover signal instructing release of bypassing after the third step is completed; a fifth step of applying checking data to the aforesaid code tagging section after the fourth step is completed; and a sixth step of judging whether the code tagging section is good or not by comparing, after receiving data outputted from the aforesaid error processing section, the data with the data used in the fourth step, in response to the data inputted by the fifth step.

A method of using a semiconductor memory device described in the fourth aspect, according to a thirteenth aspect of the present invention is featured by a fact that data is written and read into and from the aforesaid memory section by applying the first changeover signal instructing release of bypassing to the aforesaid bypass changeover section, and further applying the second changeover signal instructing release of the error processing.

A method of using a semiconductor device described in the fifth aspect, according to a fourteenth aspect of the present invention, is featured by a fact that data is written and read into and from the aforesaid memory section by applying a first changeover signal instructing release of bypassing to the aforesaid bypass changeover section, and further applying a second changeover signal instructing release of the error processing to the aforesaid error processing section.

A method of using a semiconductor memory device described in the sixth aspect, according to a fifteenth aspect of the present invention is featured by a fact that data is written and read into and from the aforesaid memory section by applying a first changeover signal instructing release of bypassing to the aforesaid bypass changeover section, and further applying a second changeover signal instructing release of error processing to the aforesaid error processing section.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Referring to the accompanying drawings there will be described varieties of preferred embodiments of the present invention.

Figure 1:
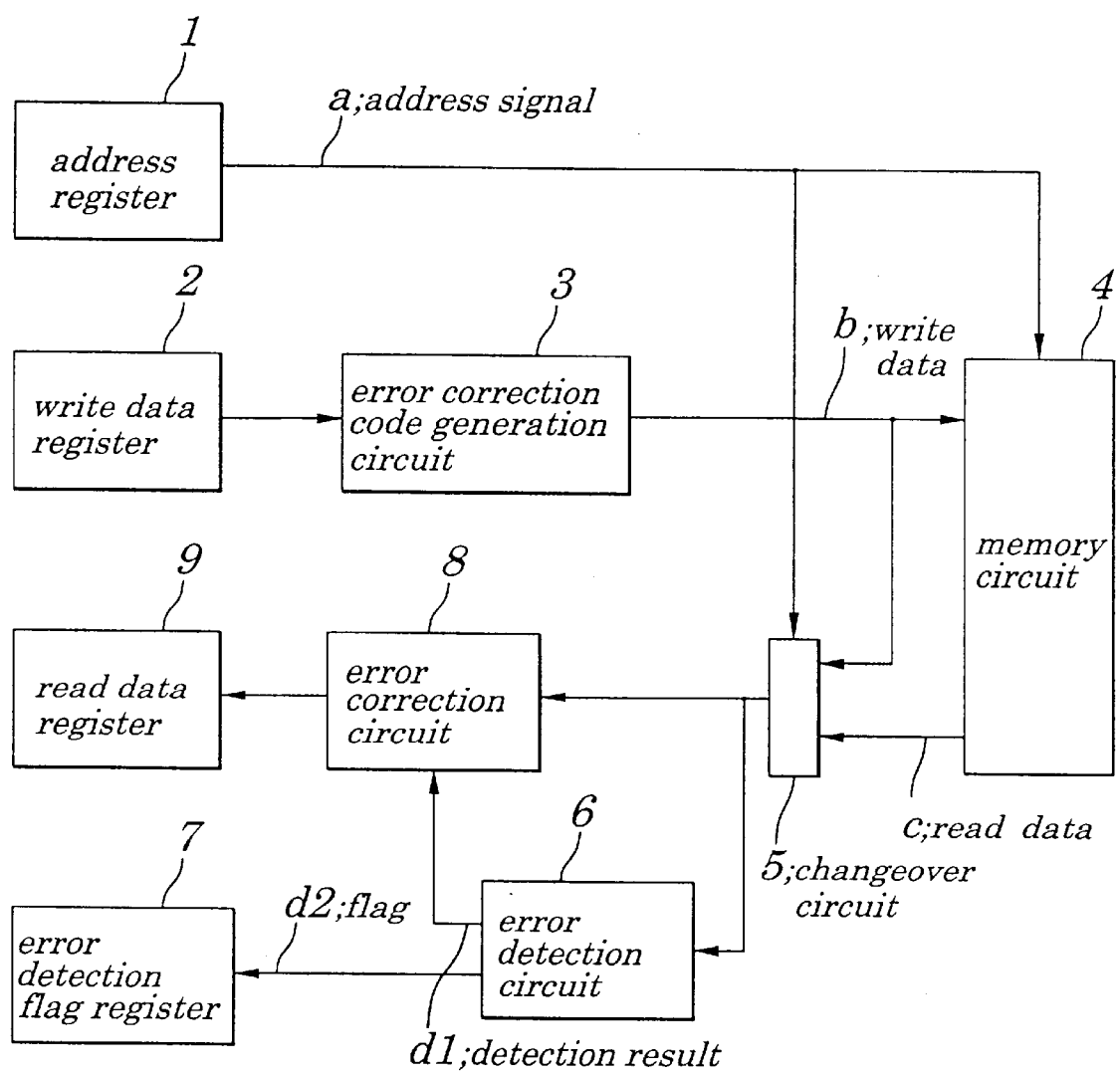
FIG. 1 is a circuit block diagram schematically illustrating the construction of a semiconductor memory device according to a first embodiment.
Figure 2:
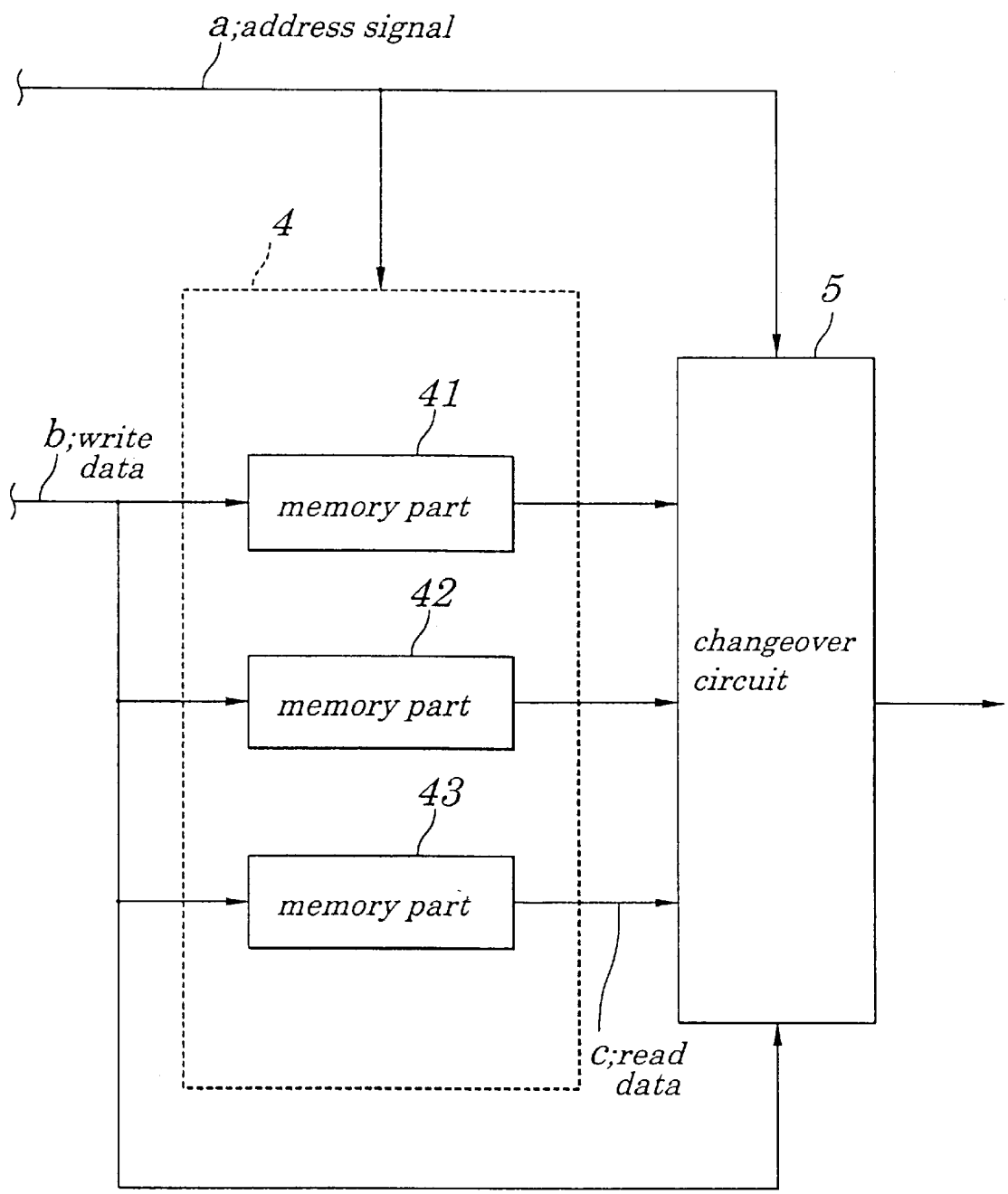
FIG. 2 is a circuit block diagram schematically illustrating the construction of a memory circuit of the semiconductor memory device of FIG. 1.

FIG. 1 is a circuit block diagram schematically illustrating the construction of a semiconductor memory device according to a first preferred embodiment of the present invention, and FIG. 2 is a circuit block diagram schematically illustrating the construction of a memory circuit of the semiconductor memory device of FIG. 1.

As illustrated in FIG. 1, an address signal from an address register 1 is sent to a memory circuit 4 and a changeover circuit 5. Write data from a write data register 2 is sent to the memory circuit 4 and the changeover circuit 5 after passing through an error correction code generation circuit 3. Read data c from the memory circuit 4 is after passing through the changeover circuit 5, sent to an error correction circuit 8 and then a read data register 9, and to an error detection circuit 6 and then to the error correction circuit 8 as a detection result d1 which will be described detail later and to an error detection flag register 7 as a flag d2.

Figure 10:
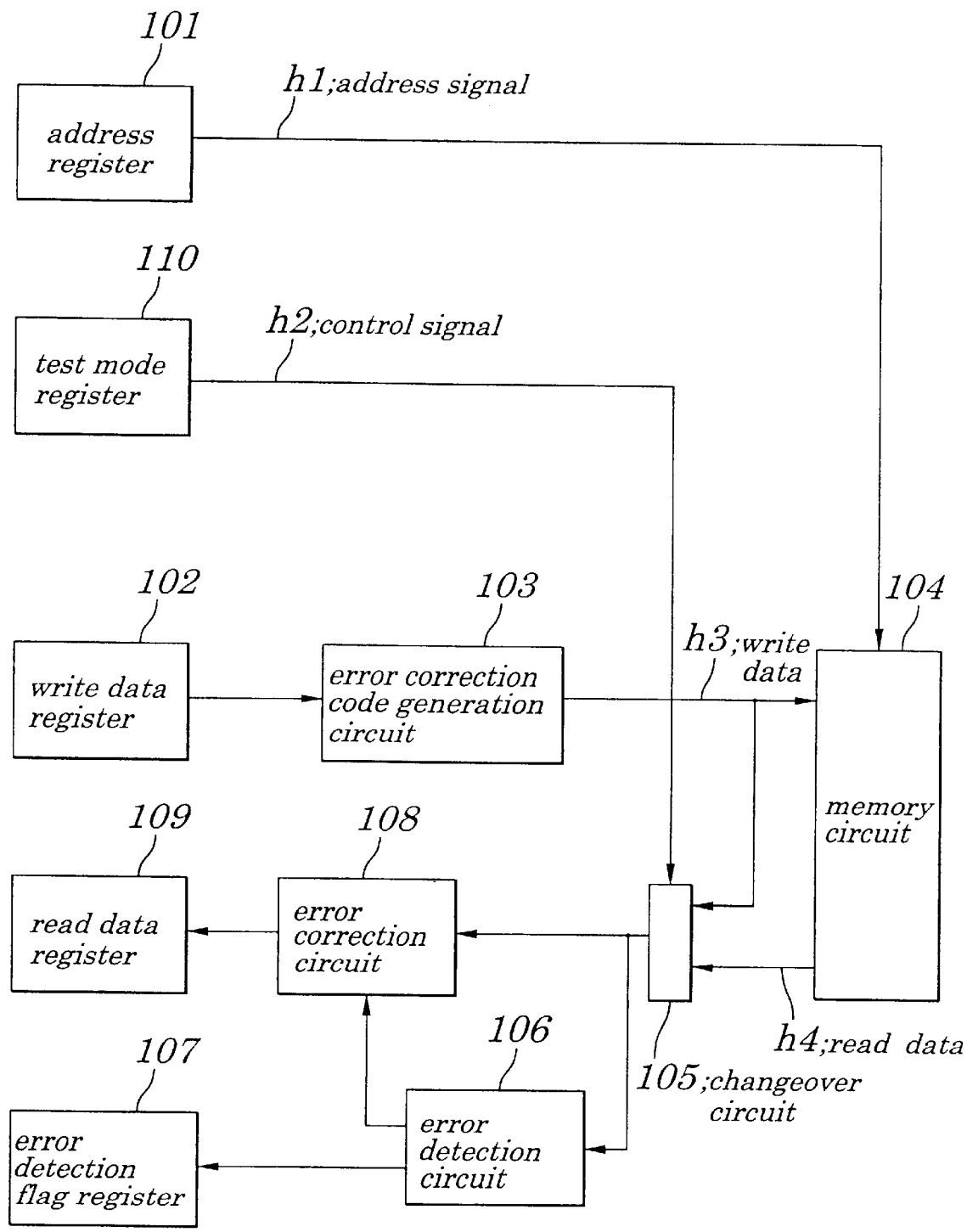
FIG. 10 is a circuit block diagram illustrating the construction of a prior art semiconductor memory device.
Figure 11:
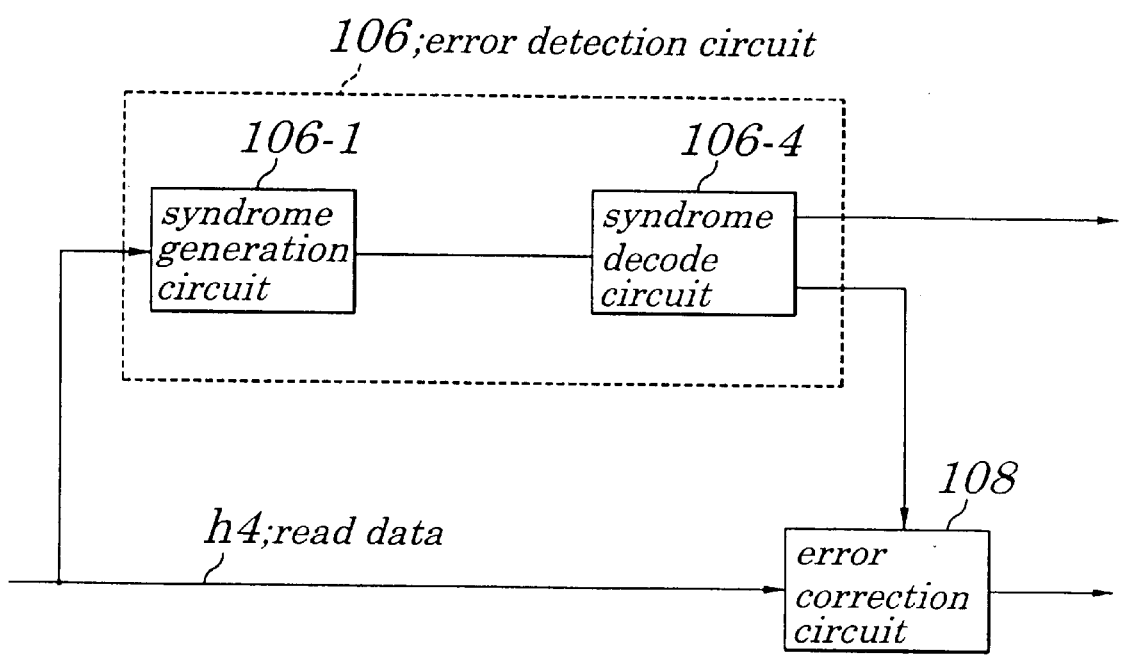
FIG. 11 is a circuit block diagram schematically illustrating the construction of an error detection circuit for use in the prior art semiconductor memory device of FIG. 10.

The constituent members 1 to 9 in FIG. 1 are the same as those members 101 to 109 in FIG. 10. Description of those members 101 to 109 will be omitted here.

The memory circuit 4 includes memory parts 41, 42, and 43 as illustrated in FIG. 2, each of which parts includes many memory areas (not shown) each for storing data. The memory circuit 4 selects on the basis of the address signal a the memory parts 41, 42, and 43, and the aforesaid memory areas which are objects to write and read when write data b from the error correction code generation circuit 3 is stored therein, and read data c is outputted therefrom.

The address signal a applied to the memory circuit 4 serves to select the memory parts 41, 42, and 43, and the memory areas in the memory circuit 4, and to control the changeover circuit 5. More specifically, upper rank 2 bits of the address signal a are used to designate the memory parts 41, 42, and 43, and to control the changeover circuit 5, and a third bit and bits after it are used to designate the memory areas of the memory parts 41, 42, and 43 upon writing and reading. Concretely, as shown in the next table 1, when the upper 2 bits of the address signal a are "00", the address signal a indicate that an object to read and write is the memory part 41.

TABLE 1

| VALUES OF ADDRESS SIGNAL | SELECTION OBJECT |
| --- | --- |
| 00 | memory part 41 |
| 01 | memory part 42 |
| 10 | memory part 43 |
| 11 | data input |

Likewise, when the upper 2 bits are "01", the address signal a takes the memory part 42 as an object, and when the upper 2 bits are "10", the address signal a takes the memory part 43 as an object. Further, when the upper rank 2 bits are "11", the address signal a indicates a memory part which is not existent in the memory circuit 4. Thus, since the address signal a does not designate any memory part in the memory circuit, the memory circuit 4 does not write and read data. An address signal a with the upper 2 bits being "11" is used as a control signal for the changeover circuit 5.

The address signal a is used as a selection signal for the memory parts 41, 42, and 43 and is used as a control signal for the changeover circuit 5. The embodiment operates in an ordinary mode when the address signal a is used for the memory circuit 4, and in a test mode when the same is used for the changeover circuit 5.

In the ordinary mode, where the upper 2 bits of the address signal a are any of "00", "01", and "10", the changeover circuit 5 connects the memory circuit 4 with the error detection circuit 6 and the error correction circuit 8.

In the test mode, the address signal a has its upper 2 bits being "11", the changeover circuit 5 separates the memory circuit 4 and connects the error correction code generation circuit 3 with the error detection circuit 5 and the error correction circuit 8.

The changeover circuit 5 uses the upper rank 2 bits of the address signal a as a control signal to control the changeover among the associated circuits.

In the following, operation of the present embodiment will be described with reference to FIGS. 1, 2.

When data is written, an external device (not shown) designates any of the memory parts 41 to 43, and adds an address signal a designating any memory area of any of the memory parts to the address register 1. When the address signal a is the ordinary mode, i.e., it takes upper 2 bits being any of "00", "01", and "10", the changeover circuit 5 connects the memory circuit 4 to the error detection circuit 6 and the error correction circuit 8.

In this situation, when the external device writes data in the write data register 2, the error correction code generation circuit 3 adds an error correction code to the data. The data to which the error correction code is added is written into the memory circuit 4 as write data b. The memory circuit 4 after receiving the write data b writes the write data b in a memory area in a memory part designated by the address signal a.

When data is read, the external device designates any of the memory parts, and adds the address signal a that designates any memory area in any memory part of the memory parts to the address register 1. The memory circuit 4 reads data from a memory area of a memory part designated by the address signal a, and sends the data to the changeover circuit 5 as read data c.

The error detection circuit 6 judges based upon an error correction code tagged to the read data c whether the read data c involves any error therein or not. When there is any error in the read data c, the error detection circuit 6 sends a flag d2 having a value "1" to the detection flag register 7. The aforesaid external device is hereby informed of occurrence of error. The error detection circuit 6 sends a detection result d1 indicative of error detection to the error correction circuit 8. The error correction circuit 8 corrects the error in the read data c, and sends the read data to the read data register 9. The external device thus receives-the data where the error involved therein is corrected.

In the following, changeover operation from the ordinary mode to the test mode will be described. In the test mode, it is checked whether or not the ECC circuit composed of the error correction code generation circuit 3, error detection circuit 6, and error correction circuit 8 is normally operated in its error detection/correction function. Firstly, the external device sends an address signal a, in which the upper 2 bits are "11", to the address register 1. The address register 1 sends the address signal a to the memory circuit 4 and the changeover circuit 5. The memory circuit 4, since the upper 2 bits of the address signal a are "11", does not have a memory part corresponding to the value "11". The memory circuit 11 hence does not write and read data. The changeover circuit 5, since the upper 2 bits of the address signal a are "11", connects the error correction code generation circuit 3 to the error detection circuit 6 and the error correction circuit 8. The memory circuit 4 is thus bypassed.

After the changeover from the ordinary mode to the test mode is completed, the external device diagnoses the ECC circuit in order to check whether or not error detection and error correction with the ECC circuit is normally operated. More specifically, the external device sends data involving any error and data not involving error to the write data register 2. These data are sent to the error detection circuit 6 and the error correction circuit 8 after passage through the error correction code generation circuit 3 and the changeover circuit 5. Since operation of the error detection circuit 6 and the error correction circuit 8 is clarified with a flag in the error detection flag register 7 and data in the date register 9, the external device can check whether or not the error detection/correction function is normally operated.

According to the present embodiment, the ordinary mode and the test mode are changed over using the address signal a so that use of a prior art control signal is eliminated. Therefore, need of generation means for generating the aforesaid control signal is eliminated. Additionally, since the address signal a is used instead of the control signal, use of the test mode register is eliminated to result in a simplified circuit construction.

Figure 3:
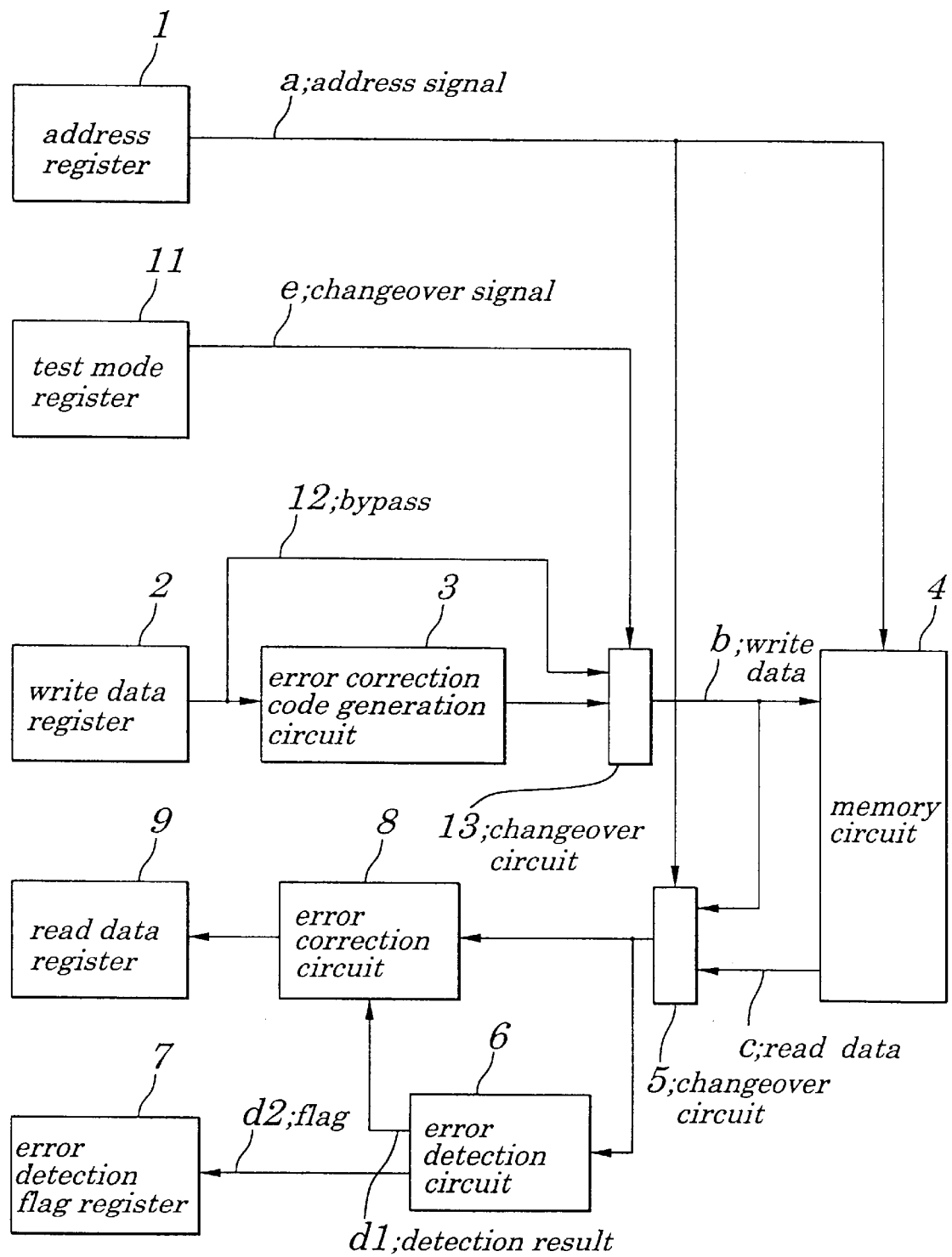
FIG. 3 is a circuit block diagram schematically illustrating the construction of a semiconductor memory device according to a second embodiment.

FIG. 3 is a circuit block diagram schematically illustrating the construction of a semiconductor memory device according to a second preferred embodiment.

In the embodiment, the error correction code generation circuit 3 is bypassed. For this, there are provided a test mode register 11, a bypass 12, and a changeover circuit 13 in addition to the construction of FIG. 1.

The test mode register 11 serves to connect the a fores aid external device to the changeover circuit 13 through a bus (not shown). The test mode register 11 temporally holds an inputted changeover signal e, and sends the changeover signal e to the changeover circuit 13. For the changeover signal e applied to the test mode register 11 there are two kinds, one that indicates first changeover and the other that indicates second changeover.

The bypass 12 is a path which is to take out data applied to the error correction code generation circuit 3 from the write data register 2. The write data register 2 applies taken-out data to the changeover circuit 13.

The changeover circuit 13 changes over the error correction code generation circuit and the bypass 2 in response to the changeover signal e. More specifically, when the changeover signal e indicates the first changeover, the changeover circuit 13 connects the error correction code generation circuit 3 to the memory circuit 4 and the changeover circuit 5. When the changeover signal e indicates the second changeover, the changeover circuit 13 connects the bypass 12 to the memory circuit 4 and the changeover circuit 5.

Operation of the second embodiment is as follows.

When the device is used in the ordinary mode, the external device sends an address signal a, which designates the memory parts 41 to 43 with the upper rank 2 bits, and the memory areas with the remaining bits, to the memory circuit 4 through the address register 1. Further, the external device applies the changeover signal e indicative of the first changeover to the changeover circuit 13 through the test mode register 11. Hereby, the changeover circuit 13 connects the error correction code generation circuit 3 to the memory circuit 4 and the changeover circuit 5. In this situation, data is written and read in accordance with the instruction of the address signal a.

When the device is used in the test mode, the external device, when it diagnoses the aforesaid ECC circuit, first checks whether or not the error detection circuit 6 and the error correction circuit 8 are normally operated. For this the external device executes first diagnosis. More specifically, the external device applies an address signal where upper rank 2 bits are set to be "11" to the address register 1. Hereby, the changeover circuit 5 connects the changeover circuit 13 to the error detection circuit 6 and the error correction circuit 8. Further, the external device applies a changeover signal e indicative of the aforesaid second changeover to the changeover circuit 13 through the test mode register 11. Hereby, the changeover circuit 13 connects the bypass 12 to the memory circuit 4 and the changeover circuit 5.

Thereafter, the external device tags an error correction code, and applies data involving error and data not involving error to the write register 2. These data bypass the error correction code generation circuit 3, and is applied to the error detection circuit 6 and the error correction circuit 8 after passage through the bypass 12, changeover circuit 13, and changeover circuit 5. Since operations of the error detection circuit 6 and the error correction circuit 8 are clarified on the basis of a flag in the error detection flag register 7 and data in the read data register 9, it can be checked whether or not only the error detection circuit 6 and the error correction circuit 8 are normally functioned.

After the first diagnosis is completed, the external device applies the changeover signal e indicative of the aforesaid first changeover to the changeover circuit 13 after passage through the test mode register 11. Hereby, the changeover circuit 13 connects the error correction code generation circuit 3 to the memory circuit 4 and the changeover circuit 5.

In this situation, the external device executes the aforesaid second diagnosis with the aid of data involving error and data not involving error in the same fashion as the embodiment 1. The second diagnosis is to check whether or not the error detection/correction function of the ECC circuit is normally operated. Since it was already checked with the first diagnosis whether or not the error detection/correction functions of the error detection circuit 6 and the error correction circuit 8 LH: are normally operated, the external device simply checks with the second diagnosis whether or not only the correction code generation circuit 3 is normally operated.

In accordance with the present second embodiment, it is possible to check with the aforesaid first and second diagnoses whether or not only the error correction code generation circuit 3 of the ECC circuit is normally operated, and further whether or not the error detection/correction functions of the error detection circuit 6 and the error correction circuit 8 of the ECC circuit are normally operated. Thus, it is possible to specify whether or not error correction code generation circuit 3 has a cause of the trouble.

Figure 4:
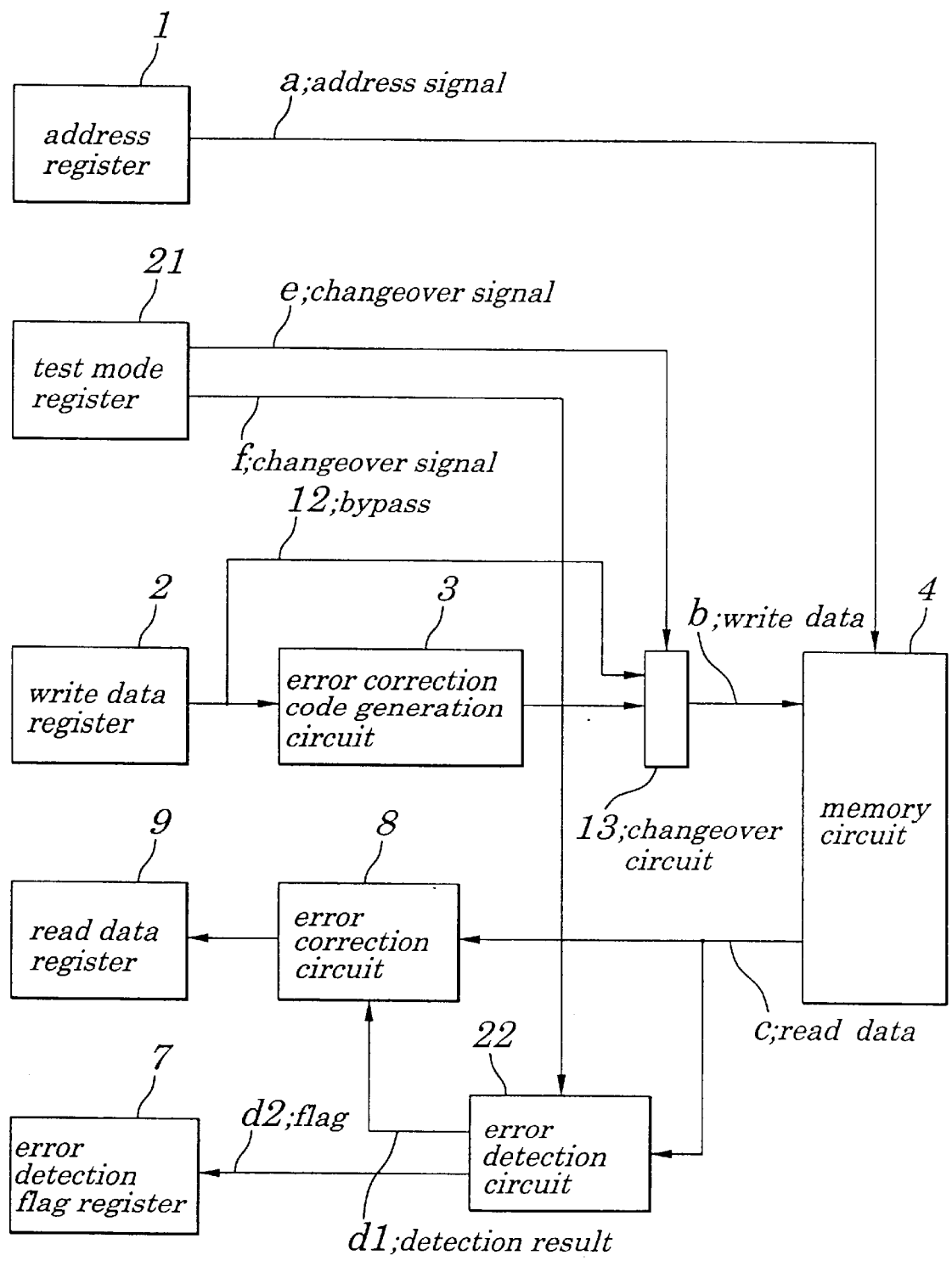
FIG. 4 is a circuit block diagram schematically illustrating a semiconductor memory device according to a third embodiment.
Figure 5:
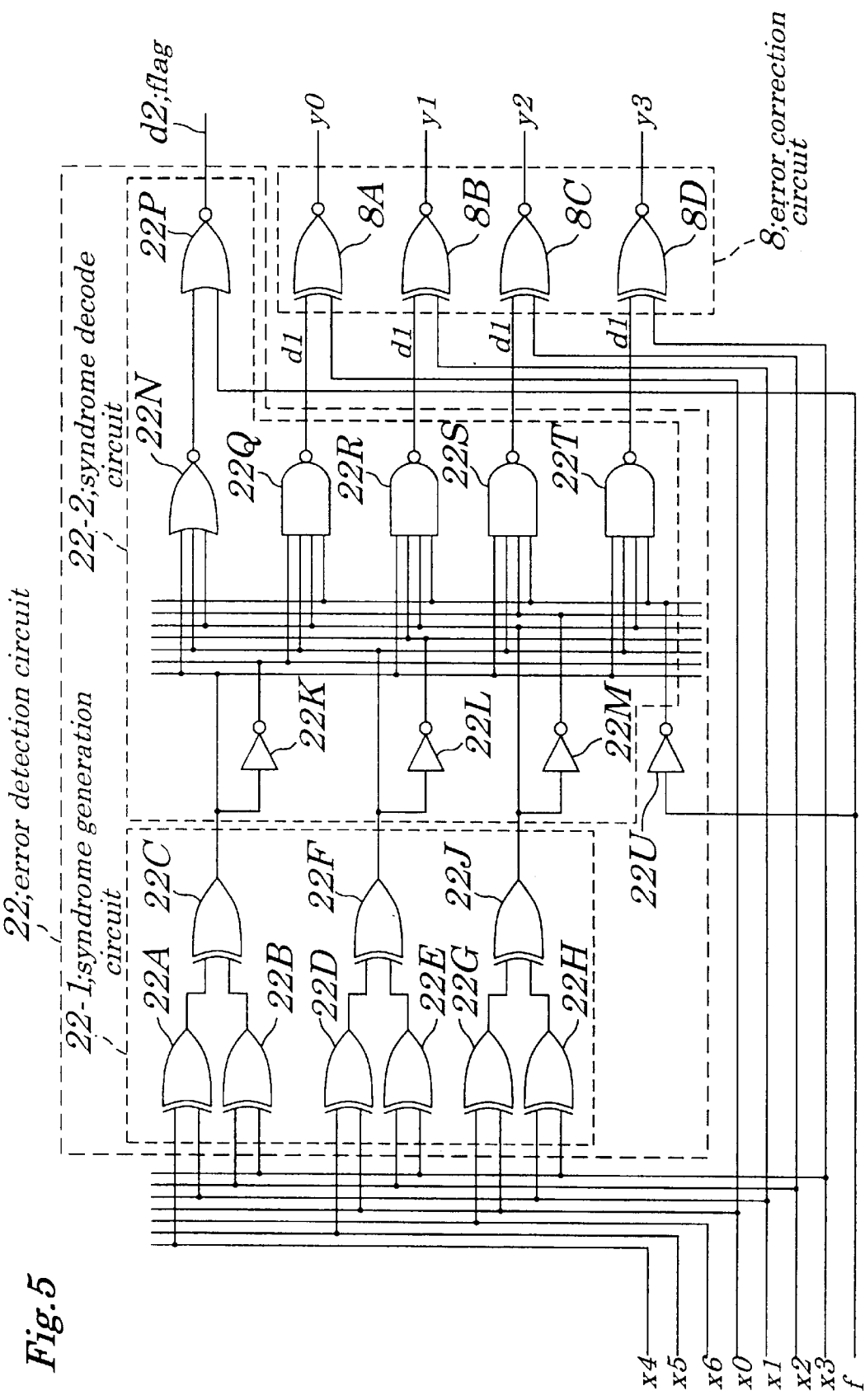
FIG. 5 is a circuit diagram of an error detection circuit and an error correction circuit for use in the foregoing semiconductor memory device.

FIG. 4 is a circuit block diagram schematically illustrating a semiconductor memory device according to a third embodiment; and FIG. 5 is a circuit diagram of an error detection circuit and an error correction circuit for use in the aforesaid semiconductor memory device.

As illustrated in FIG. 4, the present semiconductor memory device includes additionally to the constituent members of FIG. 1 a test mode register 21, a changeover circuit 13, and a bypass 12. Like symbols will be applied to like constituent members as those in FIGS. 1 and 3, and description thereof will be omitted.

The test mode register 21 after receiving a signal indicative of changeover from the aforesaid external device applies a changeover signal e to the changeover circuit 13, and applies a changeover signal f to the error detection circuit 22.

The error detection circuit 22 includes as illustrated in FIG. 5 a syndrome generation circuit 22-1 composed of EXOR gates 22A to 22J, a syndrome decode circuit 22-2 composed of inverters 22K to 22M, NOR gates 22N 22P, and NAND gates 22Q to 22T, and an inverter 22U. The syndrome generation circuit 22-1 is the same as a syndrome generation circuit 106-1 in FIG. 12, and hence description of the syndrome generation circuit 22-1 will be omitted here.

Figure 12:
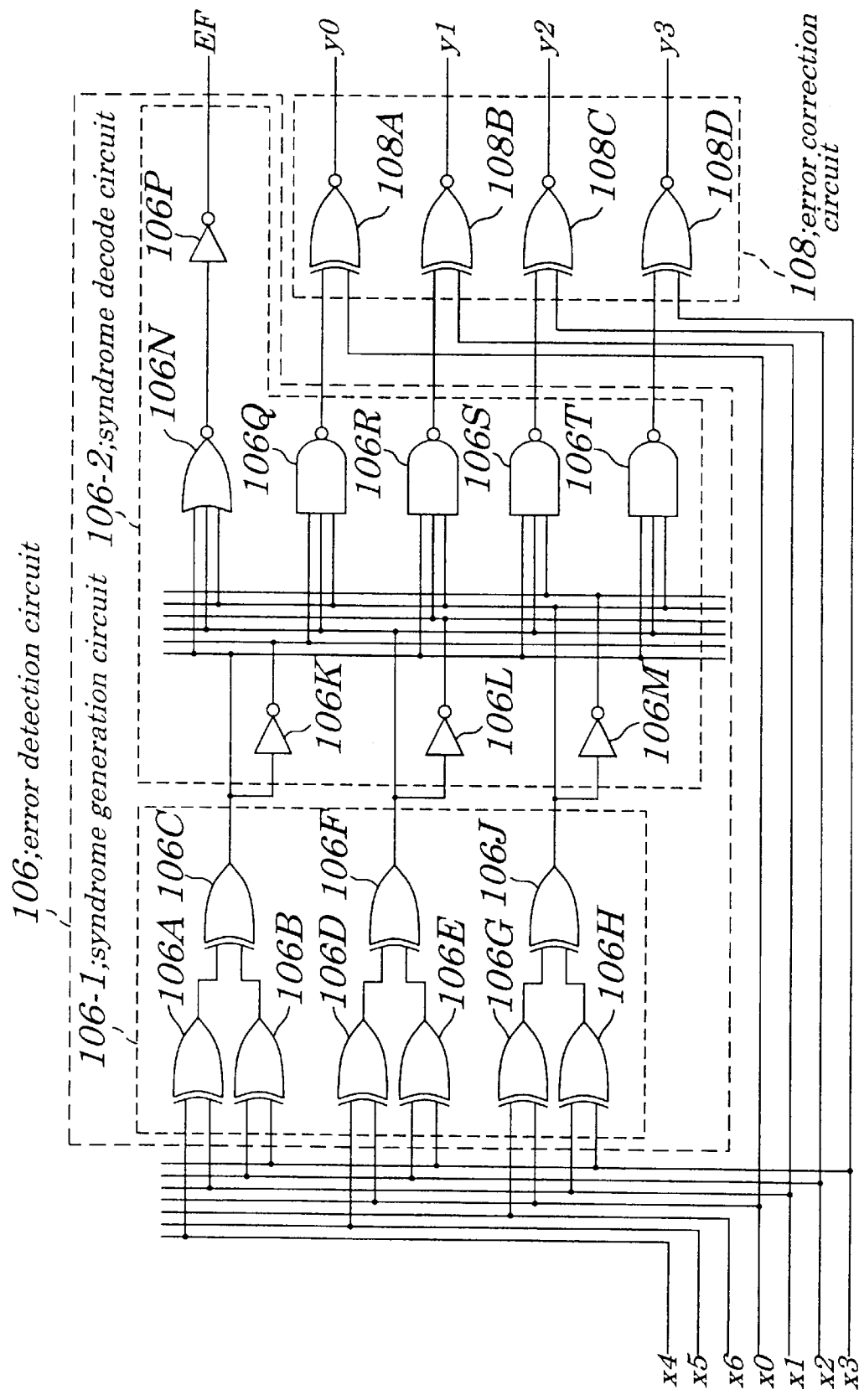
FIG. 12 is a circuit diagram schematically illustrating an error detection circuit and an error correction circuit for use in the prior art semiconductor memory device of FIG. 10.

Syndrome decode circuit 22-2 uses a NOR gate 22P instead of the inverter 106P of the syndrome decode circuit 106-2 in FIG. 12. Further, the syndrome decode circuit 22-2 applies a changeover signal f from the test mode register 21 to the NAND gates 22 Q to 22T after passage through the inverter 22U, and applies a changeover signal f to the NOR gates 22P.

As understood in the aforesaid construction, when the changeover signal f is "0", the inverter 22U outputs "1". Accordingly, to the NAND gates 22Q to 22T the value "1" is applied, so that the changeover signal f of a value "0" does not influence output values from the inverters 22K to 22M. Likewise, in the NOR gate 22P the changeover signal of a value "0" does not influence an output from the NOR gate 22N. Thus, when the changeover signal f is "0", the syndrome decode circuit 22-2 operates in the same fashion as the syndrome decode circuit 106-2 in FIG. 12.

When the changeover signal f is "1", the inverter 22U applies a value "0" to the NAND gates 22Q to 22T. Hereby, outputs of the NAND gates 22Q to 22T become "1". As a result, the error detection circuit 22 sends a detection result d1 of a value "1" indicative of no error. Simultaneously, when the changeover signal f is the value "1", the NOR gate 22P sends an output of a value "0" to the error detection flag register 7 as a flag d2. The flag d2 here indicates no error in applied data.

Thus, when the changeover signal f is a value "1", the syndrome decode circuit 22-2 is fixed to a state that indicates no error in inputted data irrespective of presence of any error in the inputted data.

Operation of the present third embodiment is as follows.

When the embodiment is used in the ordinary mode, the aforesaid external device applies a signal for changing over the changeover circuit 13 and the error detection circuit 22 to the test mode register 21. Hereby, the test mode register 21 sends a changeover signal e indicative of first changeover to the changeover circuit 13 and the changeover signal f indicative of a value "0" to the error detection circuit 22. As a result, data from the write data register 2 is applied to the memory circuit 4 after passage through the error correction code generation circuit 3 and the changeover circuit 13. Further, data read from the memory circuit 4 is applied to the error correction circuit 8 and the error detection circuit 22. Thus, use in the ordinary mode is ensured.

The present third embodiment ensures a high speed mode where data is read and written at a high speed when the memory circuit 4 is normally operated. In the following, the high speed mode will be described.

The aforesaid external device applies to the test mode register 21 a signal for changing over the changeover circuit 13 and the error detection circuit 22. Hereby, the test mode register 21 sends a changeover signal e indicative of second changeover to the changeover circuit 13 and the changeover signal f indicative of a value "1" to the error detection circuit 22. Hereby, data from the write register 2 bypasses the error correction code generation circuit 3, and is written into the memory circuit 4 after passage through the changeover circuit 13.

The error detection circuit 22 is fixed to a state where read data c is correct at all times using the changeover signal f of a value "1". The error detection circuit 22 sends to the error correction circuit 8 a detection result d1 indicative of a fact that the read data c is normal. The error correction circuit 8 after receiving the detection result d1 sends read data c read from the memory circuit 4 to the read register 9 without correcting error in the read data c.

In accordance with the present third embodiment as described above, when the write data b is written into the memory circuit 4, an error correction code from the error correction code generation circuit 3 is not tagged to the write data b. Accordingly, data from the write register 2 can be rapidly written into the memory circuit 4. Further, since the read data c from the memory circuit 4 is not subjected to error correction, the read data c can be rapidly sent to the read register 9. Thus, when the memory circuit 4 is normally operated, read and write operations with respect to the memory circuit 4 is achieved at a high speed.

Figure 6:
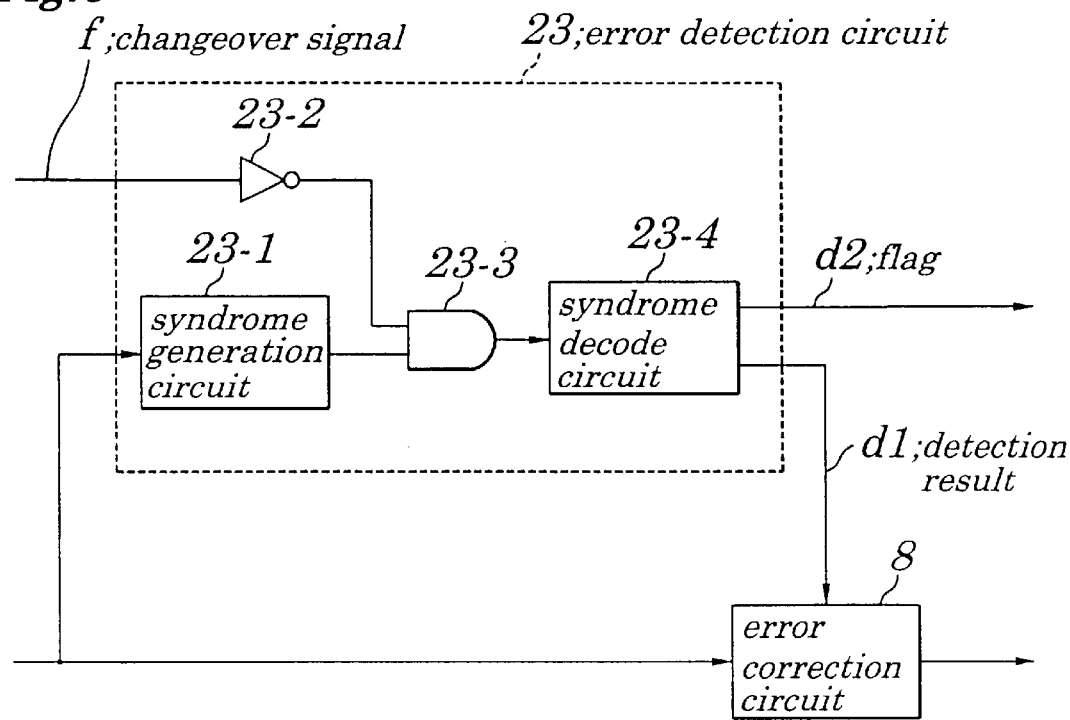
FIG. 6 is a circuit diagram partly in a block form schematically illustrating an error detection circuit and an error correction circuit both for use in a semiconductor memory device according to a fourth embodiment.

FIG. 6 is a circuit diagram partly in a block form schematically illustrating an error detection circuit and an error correction circuit both for use in a semiconductor memory device according to a fourth embodiment.

In the present embodiment, an error detection circuit 23 illustrated in FIG. 6 is used instead of the error detection circuit 22. The error detection circuit 23 includes a syndrome A generation circuit 23-1, an inverter 23-2, an AND gate 23-2, and a syndrome decode circuit 23-4, as illustrated in FIG. 6. The syndrome generation circuit 23-1 and the syndrome decode circuit 23-4 are the same as a syndrome generation circuit 106-1 and a syndrome decode circuit 106-2, respectively. Description thereof will be therefore omitted.

In the error detection circuit 23 in FIG. 6, the changeover signal f is applied to the AND gate 23-3 through the inverter 23-2. When the changeover signal f is a value "0", the inverter 23-2 provides an inverted output of the changeover signal f, i.e., the changeover signal f of a value "1" to the AND gate 23-3. Hereby, the AND gate 23-3 is opened to provide data from the syndrome generation circuit 23-1 to the syndrome decode circuit 23-4. Thus, the error detection circuit 23 achieves ordinary error detection.

When the changeover signal f is a value "1", the inverter 23-2 applies an inverted output of the changeover signal f, i.e., the changeover signal of "0" to the AND gate 23-3. Hereby, the AND gate 23-3 is closed to prevent data from the syndrome generation circuit 23-1 from being applied to the syndrome decode circuit 23-4. In this case, the AND gate 23-3 provides an output of a value of "0" to the syndrome decode circuit 23-4. Thus, the syndrome decode circuit 23-4 provides a detection result d1 of a value "0" that indicates no error to the error correction circuit 8. Simultaneously, the syndrome decode circuit 23-4 outputs a flag d2 of a value "0" that indicates that there is no error in the read data c by receiving the value "0" from the AND gate 23-3.

Thus, the error detection circuit 23 is fixed using the changeover signal f of the value "1" to a state indicating that the read data c from the memory circuit 4 is correct at all times.

In accordance with the present embodiment, high speed read/write operation is achieved using the error detection circuit 23 in the same manner as the third embodiment.

Figure 7:
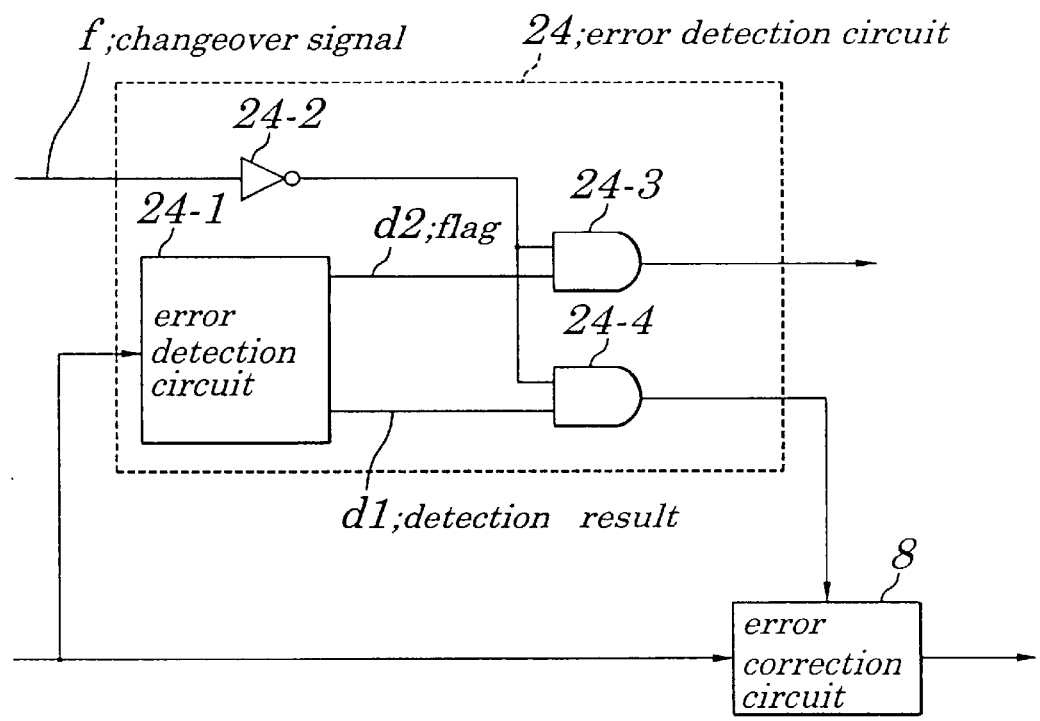
FIG. 7 is a circuit block diagram partly in a block form schematically illustrating an error detection circuit and an error correction circuit both for use in a semiconductor memory device according to a fifth embodiment of the present invention.

FIG. 7 is a circuit block diagram partly in a block form schematically illustrating an error detection circuit and an error correction circuit both for use in a semiconductor memory device according to a fifth embodiment of the present invention. In the present embodiment, an error detection circuit 24 illustrated in FIG. 7 is used instead of the error detection circuit 22 in the third embodiment. The error detection circuit 24 includes an error detection circuit 24-1, an inverter 24-2, and AND gates 24-3, 24-4, as illustrated in FIG. 7.

In the error detection circuit 24 in FIG. 7, the changeover signal f is applied to the AND gates 24-3, 24-4 through the inverter 24-2. When the changeover signal f is a value "0", the inverter 24-2 provides an inverted output of the changeover signal f, i.e., the changeover signal f of a value "1" to the AND gates 24-3, 24-4. Hereby, the AND gates 24-3, 24-4 are opened to pass a detection result d1 and a flag d2 from the error detection circuit 24-1. Hereby, the error detection circuit 24 achieves ordinary error detection in the same fashion as the prior art error detection circuit 106 in FIG. 10.

When the changeover signal f is a value "1", the inverter 24-2 provides an inverted output of the changeover signal f, i.e., the changeover signal of a value "0" to the AND gates 24-3, 24-4. Hereby, the AND gates 24-3, 24-4 are closed to bring a detection result d1 and a flag d2 from the error detection circuit 24 into 0. The error detection circuit 24 indicates using the flag d2 of a value "0" that the read data c from the memory circuit 4 is correct. The error detection circuit 24 further applies the detection result d1 of a value "0" that indicates no error to the error correction circuit 8. Hereby, the error detection circuit 24 is fixed to a state indicating the read data c from the memory circuit 4 is correct at all times.

In accordance with the present embodiment, high speed read/write operation is ensured using the error detection circuit 24 in the same fashion as the third embodiment.

Figure 8:
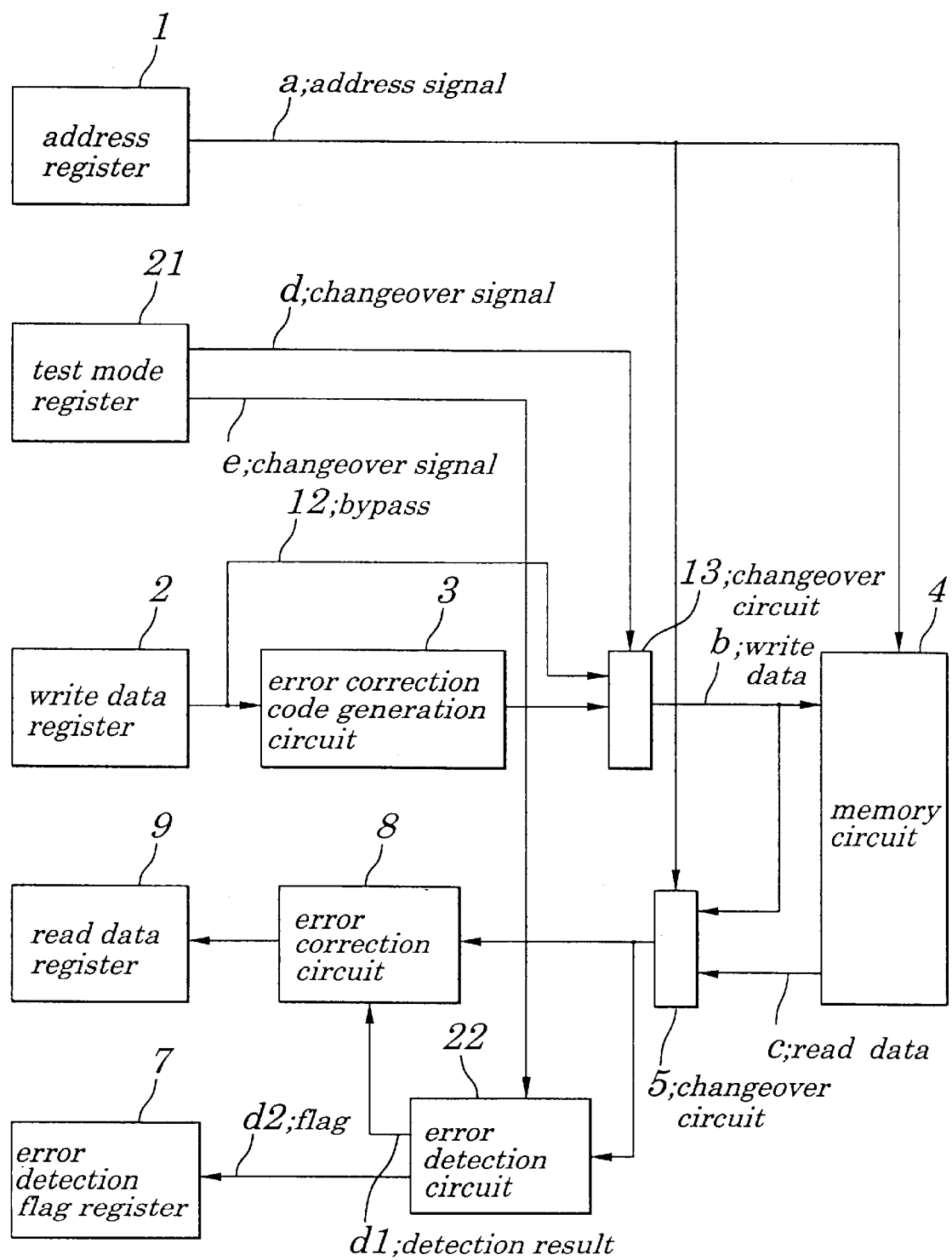
FIG. 8 is a circuit block diagram illustrating the construction of a semiconductor memory device according to a sixth embodiment of the present invention.

FIG. 8 is a circuit block diagram illustrating the construction of a semiconductor memory device according to a sixth embodiment of the present invention. The semiconductor memory device uses as illustrated in FIG. 8 the test mode register 21 and the error detection circuit 22 illustrated in FIG. 4 instead of the test mode register 11 and the error detection circuit 6 illustrated in FIG. 3.

Hereby, the memory circuit 4 can be separated to check whether or not the detection/correction function of the ECC circuit is normally operated. At this time, the error correction code generation circuit 3 can be separated to check the operations of the error correction circuit 8 and the error detection circuit 22, and thereafter check the operation of the error correction code generation circuit 3.

When the memory circuit 4 is normally operated, high speed read/write operation with respect to the memory circuit 4 is ensured by fixing the error detection circuit 22 to a state indicating that the read data c is correct at all times.

Although the first to sixth embodiments of the present invention were described as above with reference to the accompanying drawings, concrete construction is not limited to those embodiments, and design alteration may be included in the present without departing from the subject of the present invention.

For example, although the memory circuit 4 was constructed with three memory parts, three or more memory parts may be used.

Figure 9:
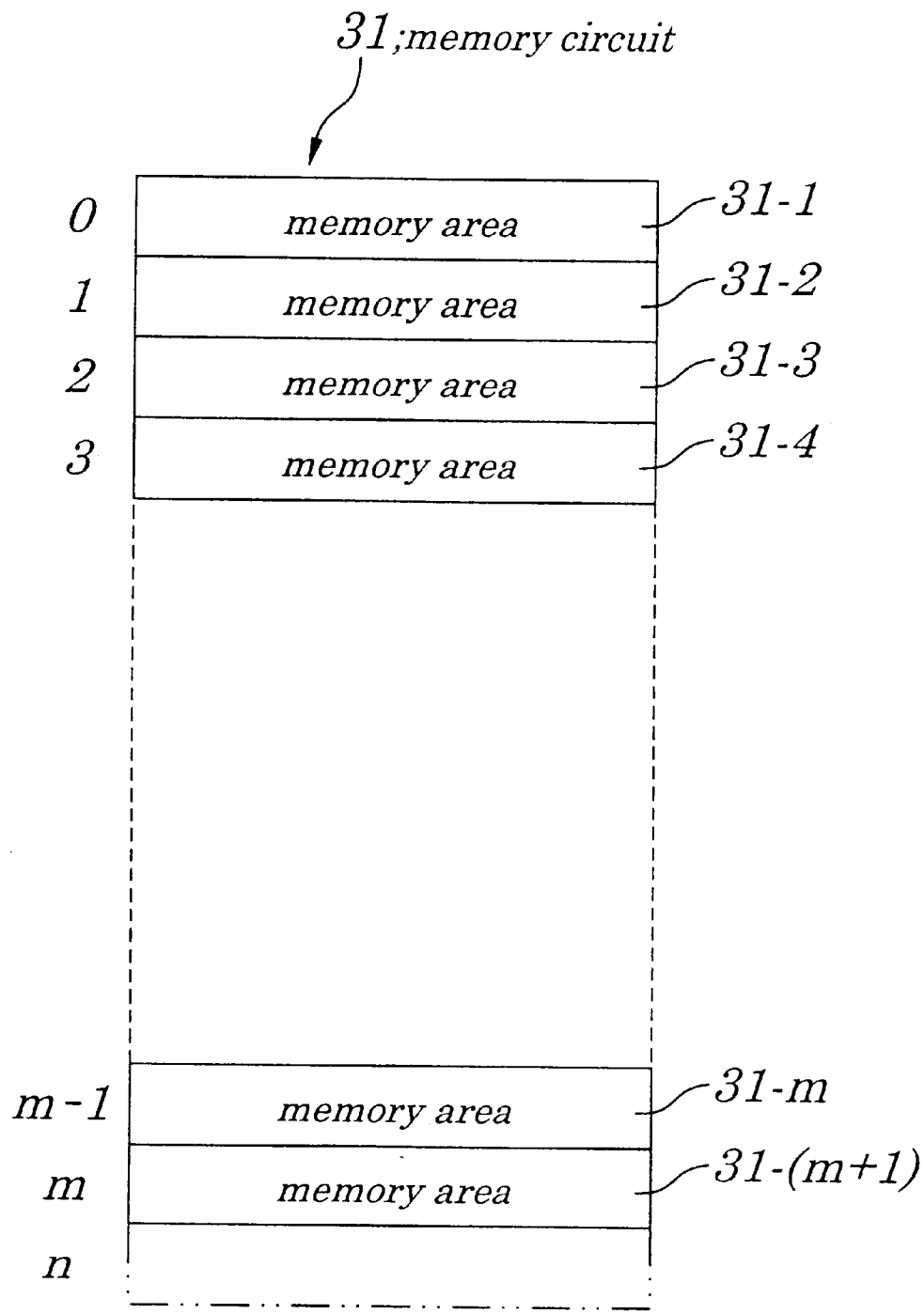
FIG. 9 is a view schematically illustrating another construction of a memory circuit for use in the semiconductor memory devices according to the first to sixth embodiments of the present embodiment.

Further, instead of the memory circuit 4 used in the first to sixth embodiments a memory circuit 31 illustrated in FIG. 9 may be used. The memory circuit 31 includes memory areas 31-1 to 31-(m+1) designated by addresses "0" to "m". The number of the memory areas 31-1 to 31-(m+1) is not coincident with 2k, and falls within 2k to 2k+1. The number of the memory areas 31-1 to 31-(m+1) is one required by an external device on which the present semiconductor memory device is mounted.

The memory circuit 31 after receiving write data b from the error correction code generation circuit 3 upon write operation stores the write data b in a memory area at an address designated by an address signal a from the address register 1. Further, the memory circuit 31 reads upon read operation data stored in the memory area at the address designated by the address signal a from the address register 1, and outputs the read data as read data c.

The changeover circuit 5 may be changed over by designating an address "n" not possessing a memory area using the memory circuit 31.

In accordance with the present invention, as described above, when an error detection/correction function of the code tagging section and the error processing section is checked, changeover of the changeover circuit for bypassing the memory section is achieved with an address signal, so that there is eliminated the need of a control signal for the changeover circuit which the prior art requires. As a result, there is eliminated the need of means for generating the control signal and means for applying the aforesaid control signal to the changeover circuit.

Further, with the present invention, operation can be checked in a state where the code tagging section and the error processing section are separated from each other by directly applying input data to the memory section while bypassing the code tagging section.

Further, with the present invention, input data can be directly applied to the memory section, and data from the memory section can be directly outputted to ensure high speed data writing and reading by bypassing the code tagging section and releasing an error processing of the error processing section when it is clarified that the memory section is normally operated.

It is thus apparent that the present invention is not limited to the above embodiments but may be changed and modified without departing from the scope and spirit of the invention.

Finally, the present invention claims the priority of Japanese Patent Application No. Hei10-070429 filed on Mar. 19, 1998, which is herein incorporated by reference.

What is claimed is:

1. A semiconductor memory device comprising:
   a memory section, which includes m memory areas where m is an arbitrary natural number, for writing and reading data into and from a memory area designated by an input address signal;
   a code tagging section for tagging a code for checking any error in input data to the input data, and sending the data to which the code is tagged to said memory section;
   a changeover section for outputting data from said memory section when said address signal designates any memory area in said memory section while outputting data from said code tagging section when said address signal does not designate any memory area in said memory section; and
   an error processing section for checking, when receiving data from said changeover section, that said data involves any error therein based upon a code tagged to the data, and when any error is detected, correcting the error and outputting said data.

2. A semiconductor memory device according to claim 1, further including:
   a bypass section for permitting data input into said code tagging section to bypass said code tagging section; and
   a bypass changeover section interposed between said code tagging section and said memory section for sending the data from said code tagging section or the data from said bypass section to said memory section.

3. A method of checking a semiconductor memory device comprising a memory section, which includes m memory areas where m is an arbitrary natural number, for writing and reading data into and from a memory area designated by an input address signal; a code tagging section for tagging a code for checking any error in input data to the input data, and sending the data to which the code is tagged to said memory section; a changeover section for outputting data from said memory section when said address signal designates any memory area in said memory section while outputting data from said code tagging section when said address signal does not designate any memory area in said memory section; and an error processing section for checking, when receiving data from said changeover section, that said data involves any error therein based upon a code tagged to the data, and when any error is detected, correcting the error and outputting said data, the method comprising the steps of:
(1) applying an address signal that does not designate a memory area in said memory section to said changeover section;
(2) applying checking data to said code tagging section after said first step is completed; and
(3) judging whether or not said code tagging section and said error processing section are good by comparing, after receiving data output from said error processing section in response to data input in said second step, said received data and the data used in the second step.

4. A method of checking a semiconductor memory device comprising a memory section, which includes m memory areas where m is an arbitrary natural number, for writing and reading data into and from a memory area designated by an input address signal; a code tagging section for tagging a code for checking any error in input data to the input data, and sending the data to which the code is tagged to said memory section; a changeover section for outputting data from said memory section when said address signal designates any memory area in said memory section while outputting data from said code tagging section when said address signal does not designate any memory area in said memory section; an error processing section for checking, when receiving data from said changeover section, that said data involves any error therein based upon a code tagged to the data, and when any error is detected, correcting the error and outputting said data; a bypass section for permitting data input into said code tagging section to bypass said code tagging section; and a bypass changeover section interposed between said code tagging section and said memory section for sending the data from said code tagging section or the data from said bypass section to said memory section, the method comprising the steps of:
(1) applying an address signal that does not designate a memory part in said memory section to said changeover section, and applying a changeover signal instructing bypassing to said bypass changeover section;
(2) applying checking data to said code tagging section after said first step is completed;
(3) judging whether or not said code tagging section and said error processing section is good by comparing, after receiving data output from said error processing section, said received data and the data used in said second step in response to data input in said second step;
(4) applying a changeover signal instructing release of bypassing to said bypass changeover section, after said third step is completed;
(5) applying checking data to said code tagging section after said fourth step is completed; and
(6) judging whether or not said code tagging section is good by comparing, after receiving data output from said error processing section, said data output from said error processing section and data used in the fourth step.

5. A semiconductor memory device comprising:
a memory section, which includes p memory parts where p is an arbitrary natural number, each memory part comprising n memory areas where n is an arbitrary natural number, for writing and reading data into and from said memory area designated by an input address signal;
a code tagging section for tagging a code to check any error in input data to the input data, and sending the data to which the code is tagged to said memory section;
a changeover section for outputting the data from said memory section when said address signal designates a memory part of said memory section while when said address signal does not designate a memory part of said memory section, outputting data from said code tagging section; and
an error processing section for checking, after receiving data from said changeover section, whether or not said data involves any error therein based upon the code tagged to the data, and when any error is detected, correcting said error and outputting said data.

6. A semiconductor memory device according to claim 5, further including:
a bypass section for permitting data input into said code tagging section to bypass said code tagging section; and
a bypass changeover section interposed between said code tagging section and said memory section for sending the data from said code tagging section or the data from said bypass section to said memory section.

7. A method of checking a semiconductor memory device comprising a memory section, which includes p memory parts where p is an arbitrary natural number, each memory part comprising n memory areas where n is an arbitrary natural number, for writing and reading data into and from said memory area designated by an input address signal; a code tagging section for tagging a code to check any error in input data to the input data, and sending the data to which the code is tagged to said memory section; a changeover section for outputting the data from said memory section when said address signal designates a memory part of said memory section while when said address signal does not designate a memory part of said memory section, outputting data from said code tagging section; and an error processing section for check, after receiving data from said changeover section, whether or not said data involves any error therein based upon the code tagged to the data, and when any error is detected, correcting said error and outputting said data, the method comprising the steps of:
(1) applying an address signal that does not designate a memory part in said memory section to said changeover section;
(2) applying checking data to said code tagging section after said first step is completed; and
(3) judging whether or not said code tagging section and said error processing section are good by comparing, after receiving data output from said error processing section, said received data and the data used in said second step in response to data input in said second step.

8. A semiconductor memory device comprising:
a memory section writing and reading data with the aid of an input address signal;
a code tagging section for tagging a code for checking any error in input data to the input data, and outputting the data to which the code is tagged;
a bypass section for permitting the data input into the code tagging section to bypass said code tagging section;
a bypass changeover section for sending the data from said code tagging section or the data from said bypass section to said memory section in response to an input first changeover signal;
a changeover section for outputting data from said memory section when said address signal designates a memory area in said memory section, while when said address signal does not designate a memory area of said memory section, outputting the data from said bypass changeover section; and an error processing section for checking, after receiving the data from said memory section when the input second changeover signal indicates an error processing, presence of any error in said data from said memory section based upon a code tagged to said data, and, when any error is detected, correcting and outputting the error, and when the input second changeover signal indicates release of the error processing, outputting the data received from said memory section.

9. A method of checking a semiconductor memory device comprising a memory section writing and reading data with the aid of an input address signal; a code tagging section for tagging a code for checking any error in input data to the input data, and outputting the data to which the code is tagged; a bypass section for permitting the data input into the code tagging section to bypass said code tagging section; a bypass changeover section for sending the data from said code tagging section or the data from said bypass section to said memory section in response to an input first changeover signal; a changeover section for outputting data from said memory section when said address signal designates a memory area in said memory section, while when said address signal does not designate a memory area of said memory section, outputting the data from said bypass changeover section; and an error processing section for checking, after receiving the data from said memory section when the input second changeover signal indicates an error processing, presence of any error in said data from said memory section based upon a code tagged to said data, and, when any error is detected, correcting and outputting the error, and when the input second changeover signal indicates release of the error processing, outputting the data received from said memory section, the method comprising the steps of:

(1) applying a first changeover signal instructing bypassing to said bypass changeover section, and further applying a second changeover signal indicative of an error processing to said error processing section;

(2) applying checking data to said code tagging section after said first step is completed;

(3) judging whether or not said code tagging section and said error processing section is good by comparing, after receiving data output from said error processing section, said received data and the data used in said second step in response to data input in said second step;

(4) applying a changeover signal instructing release of bypassing to said bypass changeover section, after said third step is completed;

(5) applying checking data to said code tagging section after said fourth step is completed;

(6) judging whether or not said code tagging section is good by comparing, after receiving data output from said error processing section, said received data and data used in said fourth step in response to data input in said fifth step.

10. A method of using a semiconductor memory device comprising a memory section writing and reading data with the aid of an input address signal; a code tagging section for tagging a, code for checking any error in input data to the input data, and outputting the data to which the code is tagged; a bypass section for permitting the data input into the code tagging section to bypass said code tagging section; a bypass changeover section for sending the data from said code tagging section or the data from said bypass section to said memory section in response to an input first changeover signal; a changeover section for outputting data from said memory section when said address signal designates a memory area in said memory section, while when said address signal does not designate a memory area of said memory section, outputting the data from said bypass changeover section; and an error processing section for checking, after receiving the data from said memory section when the input second changeover signal indicates an error processing, presence of any error in said data from said memory section based upon a code tagged to said data, and, when any error is detected, correcting and outputting the error, and when the input second changeover signal indicates release of the error processing, outputting the data received from said memory section, the method comprising the step of:

applying a first changeover signal instructing release of bypass to said bypass changeover section, and applying a second changeover signal indicative of release of an error processing to said error processing section, and hereby writing and reading data into and from said memory section.

11. A semiconductor memory device comprising:

a memory section, which includes m memory areas each for storing data, for writing and reading data into and from a memory area designated by an input address signal;

a code tagging section for tagging a code for checking any error in input data to the input data, and outputting the data to which said code is tagged;

a bypass section for permitting the data input into said code tagging section to bypass said code tagging section;

a bypass changeover section for sending the data from said code tagging section or the data from said bypass section in response to an input first changeover signal;

a changeover section for outputting the data from said memory section when said address signal designates a memory area in said memory section, while when said address signal does not designate a memory area of said memory section outputting the data from said bypass changeover section; and an error processing section for checking, after receiving the data from said changeover section when an input second changeover signal indicates an error processing, presence of any error in the received data based upon a code tagged to the received data, and when any error is detected, correcting said error and outputting said data, while when the input second changeover signal indicates release of the error processing, outputting the data received from said changeover section.

12. A method of checking a semiconductor memory device comprising a memory section, which includes m memory areas each for storing data, for a writing and reading data into and from a memory area designated by an input address signal; a code tagging section for tagging a code for checking any error in input data to the input data, and outputting the data to which said code is tagged; a bypass section for permitting the data input into said code tagging section to bypass said code tagging section; a bypass changeover section for sending the data from said code tagging section or the data from said bypass section in response to an input first changeover signal; a changeover section for outputting the data from said memory section when said address signal designates a memory area in said memory section, while when said address signal does not designate a memory area of said memory section outputting the data from said bypass changeover section; and an error processing section for checking, after receiving the data from said changeover section when an input second changeover signal indicates an error processing, presence of any error in the received data based upon a code tagged to the received data, and when any error is detected, correcting said error and outputting said data, while when the input second changeover signal indicates release of the error processing, outputting the data received from said changeover section, the method comprising the steps of:
(1) applying an address signal that does not designate a memory part of said memory section to said changeover section, and applying a first changeover signal instructing bypassing to said bypass changeover section and further applying a second changeover signal indicative of an error processing to said error processing section;
(2) applying checking data to said code tagging section after said first step is completed;
(3) judging whether or not said error processing section is good by comparing, after receiving data output from said error processing section, said received data and data used in said second step in response to data input in said second step;
(4) applying a changeover signal instructing release for instructing release of bypassing to said bypass-changeover section after said third step is completed;
(5) applying checking data to said code tagging section after said fourth step is completed;
(6) judging whether or not said code tagging section is good by comparing, after receiving data output from said error processing section, said received data and data used in said step 4 in response to data input in said fifth step.

13. A method of using a semiconductor memory device comprising a memory section, which includes m memory areas each for storing data, for writing and reading data into and from a memory area designated by an input address signal; a code tagging section for tagging a code for checking any error in input data to the input data, and outputting the data to which said code is tagged; a bypass section for permitting the data input into said code tagging section to bypass said code tagging section; a bypass changeover section for sending the data from said code tagging section or the data from said bypass section in response to an input first changeover signal; a changeover section for outputting the data from said memory section when said address signal designates a memory area in said memory section, while when said address signal does not designate a memory area of said memory section outputting the data from said bypass changeover section; and an error processing section for checking, after receiving the data from said changeover section when an input second changeover signal indicates an error processing, presence of any error in the received data based upon a code tagged to the received data, and when any error is detected, correcting said error and outputting said data, while when the input second changeover signal indicates release of the error processing, outputting the data received from said changeover section, the method comprising the step of:
applying a first changeover signal instructing release of bypassing to said bypass changeover section, and applying a second changeover signal indicative of release of an error processing to said error processing section, and hereby writing and reading data into and from said memory section.

14. A method of using a semiconductor memory device comprising a memory section, which includes m memory areas each for storing data, for writing and reading data into and from a memory area designated by an input address signal; a code tagging section for tagging a code for checking any error in input data to the input data, and outputting the data to which said code is tagged; a bypass section for permitting the data input into said code tagging section to bypass said code tagging section; a bypass changeover section for sending the data from said code tagging section or the data from said bypass section in response to an input first changeover signal; a changeover section for outputting the data from said memory section when said address signal designates a memory area in said memory section, while when said address signal does not designate a memory area of said memory section outputting the data from said bypass changeover section; and an error processing section for checking, after receiving the data from said changeover section when an input second changeover signal indicates an error processing, presence of any error in the received data based upon a code tagged to the received data, and when any error is detected, correcting said error and outputting said data, while when the input second changeover signal indicates release of the error processing, outputting the data received from said changeover section, the method comprising the step of:
applying a first changeover signal instructing release of bypassing, and applying a second changeover signal indicative of release of an error processing to said error processing section, hereby writing and reading data into and from said memory section.

15. A semiconductor memory device comprising:
a memory section, which includes p memory parts, each memory part including n memory areas, for writing and reading data into and from a said memory area designated by an input address signal after said input address signal designates a said memory part;
a code tagging section for tagging a code for checking any error in input data to the input data, and outputting the data to which the code is tagged;
a bypass section for permitting the data input into said code tagging section by bypass said code tagging section;
a bypass changeover section for sending the data from said code tagging section or the data from said bypass section to said memory section in response to an input first changeover signal;
a changeover section for outputting the data from said memory section when said address signal designates a memory part in said memory section, while when said address signal does not designate the memory part in said memory section, outputting the data from said bypass changeover section; and
an error processing section for checking, after receiving the data from said changeover section, presence of any error in the data based upon a code tagged to the data, and when there is detected any error, correcting the error and outputting the data when an input second changeover signal indicated an error processing, while when the input second changeover signal indicates release of the error processing, outputting the data received from said changeover section.

16. A method of checking a semiconductor memory device comprising a memory section, which includes p memory parts, each memory part including n memory areas, for writing and reading data into and from a said memory area designated by an input address signal after said input address signal designates a said memory part; a code tagging section for tagging a code for checking any error in input data to the input data, and outputting the data to which the code is tagged; a bypass section for permitting the data input into said code tagging section by bypass said code tagging section; a bypass changeover section for sending the data from said code tagging section or the data from said bypass section to said memory section in response to an input first changeover signal; a changeover section for outputting the data from said memory section when said address signal designates a memory part in said memory section, while when said address signal does not designate the memory part in said memory section, outputting the data from said bypass changeover section; and an error processing section for checking, after receiving the data from said changeover section, presence of any error in the data based upon a code tagged to the data, and when there is detected any error, correcting the error and outputting the data when an input second changeover signal indicated an error processing, while when the input second changeover signal indicates release of the error process outputting the data received from said changeover section, the method comprising the steps of:

(1) applying an address signal that does not designate a memory part of said memory section to said changeover section, and applying a first changeover signal designating bypassing to said bypass changeover section, and further applying a second changeover signal indicative of an error processing to said error processing section;

(2) applying checking data to said cod e tagging section after said first step is completed;

(3) judging whether or not said error processing section is good by comparing, after receiving data output from said error processing section, said received data hand data used in said second step in response to data input in said second step;

(4) applying a changeover signal instructing release for instructing release to bypassing to said bypass changeover section after said third step is completed;

(5) applying checking data to said code tagging section after said fourth step is completed; and (6) judging whether or not said code tagging section is good by comparing, after receiving data output from said error processing section, said received data and data used in said step 4.

* * * * *